(12) United States Patent
Brandl

(10) Patent No.: US 7,513,434 B2
(45) Date of Patent: Apr. 7, 2009

(54) DEVICE COMPRISING TWO MUTUALLY ADAPTED IMPEDANCES FOR THE PURPOSE OF POWER TRANSMISSION

(75) Inventor: Roland Brandl, Graz (AT)

(73) Assignee: NXP B.V., Eindhoven (NL)

( * ) Notice: Subject to any disclaimer, the term of this patent is extended or adjusted under 35 U.S.C. 154(b) by 590 days.

(21) Appl. No.: 10/526,859

(22) PCT Filed: Aug. 29, 2003

(86) PCT No.: PCT/IB03/03961

§ 371 (c)(1),
(2), (4) Date: Sep. 14, 2005

(87) PCT Pub. No.: WO2004/023652

PCT Pub. Date: Mar. 18, 2004

(65) Prior Publication Data

US 2006/0054686 A1  Mar. 16, 2006

(30) Foreign Application Priority Data

Sep. 5, 2002 (EP) ................................. 02102307

(51) Int. Cl.
  *G06K 19/06* (2006.01)
  *G06K 7/08* (2006.01)
(52) U.S. Cl. ..................................... 235/492; 235/451
(58) Field of Classification Search ................. 235/435, 235/441, 492
See application file for complete search history.

(56) References Cited

U.S. PATENT DOCUMENTS 5,866,891 A * 2/1999 Fujimoto et al. ............. 235/435
6,533,178 B1 * 3/2003 Gaul et al. .................... 235/492
2002/0096568 A1 * 7/2002 Arisawa ....................... 235/492

FOREIGN PATENT DOCUMENTS

EP  1 164 532  12/2001

* cited by examiner

*Primary Examiner*—Karl D Frech
*Assistant Examiner*—April A Taylor
(74) *Attorney, Agent, or Firm*—Aaron Waxler

(57) ABSTRACT

A device (1) for processing a signal (S) has firstly an antenna configuration (5) that is arranged to transmit a signal (S), that has at least one antenna-configuration terminal (6, 7) intended for connecting the antenna configuration (5) to a circuit (2), and that has an antenna-configuration impedance (ZA) at the antenna-configuration terminal (6, 7), and the circuit (2) further has at least one circuit terminal (3, 4) at which the circuit (2) has a circuit impedance (ZS) and at which the circuit (2) is connected to the antenna-configuration terminal (6, 7) for the purpose of power transmission between the antenna configuration (5) and the circuit (2) by using the signal (S), at least one of the two impedances (ZA, ZS) having, in respect of its reactance (YA, YS), a difference in reactance value ($\Delta$Y) from a nominal reactance value ($Y_{NOM}$) that is adapted for the transmission of power between the antenna configuration (5) and the circuit (2), and one of the two impedances (ZA, ZS) having a resistance (XA, XS) whose value (X) is greater than a nominal resistance value ($X_{NOM}$) that is adapted for the transmission of power between the antenna configuration (5) and the circuit (2) and is smaller than a maximum resistance value ($X_{MAX}$) that is a function of the difference in the reactance value ($\Delta$Y).

13 Claims, 3 Drawing Sheets

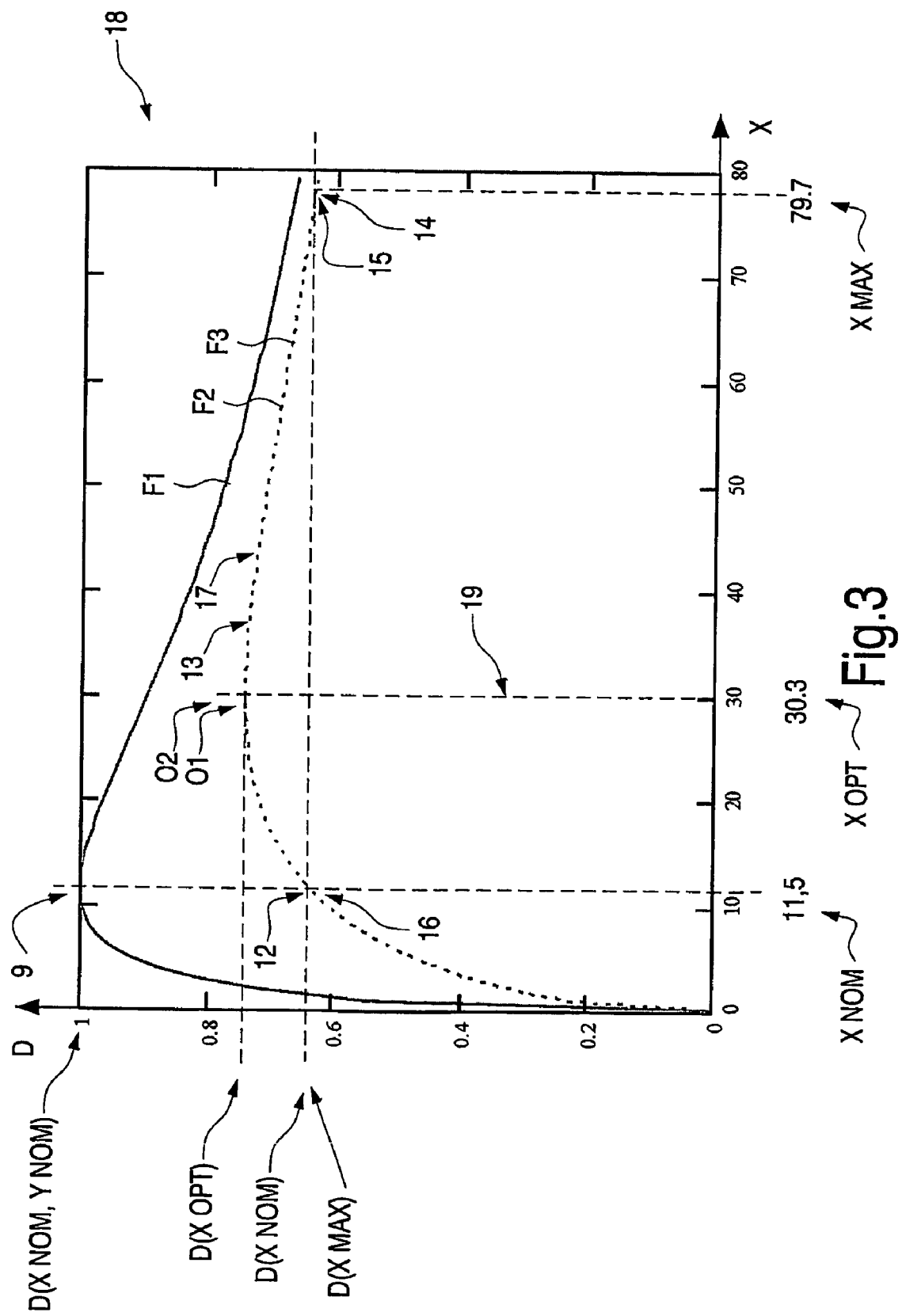

DEVICE COMPRISING TWO MUTUALLY ADAPTED IMPEDANCES FOR THE PURPOSE OF POWER TRANSMISSION

The invention relates to a device for processing a signal, which device has an antenna configuration, which antenna configuration is arranged to transmit a signal, the antenna configuration having at least one antenna-configuration terminal that is intended for connecting the antenna configuration to a circuit and the antenna configuration having an antenna-configuration impedance at the antenna-configuration terminal, and which device has the circuit, which circuit has at least one circuit terminal at which the circuit has a circuit impedance and at which the circuit is connected to the antenna-configuration terminal for the purpose of power transmission between the antenna configuration and the circuit by using the signal, wherein at least one of the two impedances has, in respect of its reactance, a difference in reactance value from a nominal reactance value that is adapted for the transmission of power between the antenna configuration and the circuit.

The invention further relates to an antenna configuration for a device for processing a signal, which antenna configuration is arranged to transmit a signal and which antenna configuration has at least one antenna-configuration terminal that is intended for connection to a circuit of the device, the circuit having at least one circuit terminal at which the circuit has a circuit impedance and at which the circuit is connectable to the antenna-configuration terminal by using the signal for the purpose of power transmission between the antenna configuration and the circuit, and which antenna configuration has an antenna-configuration impedance at the antenna-configuration terminal, wherein at least one of the two impedances has, in respect of its reactance, a difference in reactance value from a nominal reactance value that is adapted for the transmission of power between the antenna configuration and the circuit.

The invention further relates to a circuit for a device for processing a signal, which circuit has at least one circuit terminal at which the circuit has a circuit impedance and at which the circuit is connectable to an antenna-configuration terminal for the purpose of power transmission between an antenna configuration and the circuit by using the signal, which antenna configuration is arranged for the transmission of the signal, which antenna configuration has at least one antenna-configuration terminal that is intended for connecting the antenna configuration to the circuit, and which antenna configuration has an antenna-configuration impedance at the antenna-configuration terminal, wherein at least one of the two impedances has, in respect of its reactance, a difference in reactance value from a nominal reactance value that is adapted for the transmission of power between the antenna configuration and the circuit.

A device of the kind specified in the first paragraph, an antenna configuration of the kind specified in the second paragraph and a circuit of the kind specified in the third paragraph are known from patent WO 00/67373.

The known device that has the known antenna configuration and the known circuit is a data carrier that is arranged for non-contacting communication with a communication arrangement. In the case of the known data carrier, a signal that is of a carrier frequency and that is emitted by the communication arrangement can be received by means of the antenna configuration and transmitted to the circuit. By using the signal transmitted to it, the circuit is arranged to generate a supply voltage for its own operation, the value of the supply voltage that can be generated being dependent on the distance at the time between the data carrier and the communication arrangement and showing an increase as the distance becomes smaller. The value of the supply voltage, and hence too the distance between the data carrier and the communication arrangement that can be used for the operation of the data carrier, is also affected by the electrical power that can be transmitted at the time from the antenna configuration to the circuit. In the case of the known data carrier, provision is therefore made, for the purpose of optimizing the power transmission, for an antenna impedance of the antenna configuration and a circuit impedance of the circuit to be adapted or matched, respectively, to one another, the value of the antenna-configuration impedance and the value of the circuit impedance, at a carrier frequency, being selected to have a complex conjugate relationship to one another so that the reactances of the two impedances are of a nominal reactance and the resistances of the two impedances are of a nominal resistance.

In the known data carrier, there is the problem that, despite the adaption of the two impedances to one another that supposedly benefits the transmission of power between the antenna configuration and the circuit, at least one of the two impedances will in fact have, in respect of its reactance, a difference in the value of its reactance from a nominal reactance value that is adapted to the transmission of power between the antenna configuration and the circuit. Even with a relatively small difference of only a few percent of the nominal reactance value, up to 40% of the distance that could be used if the reactance were of its nominal value can no longer be used, because the difference in the reactance value causes a reflection when power is transmitted from the antenna configuration to the circuit, which means that the electrical power available in the circuit for generating the supply voltage is reduced by the power that is reflected. A difference in reactance value of this kind may be caused in the antenna configuration for production-related reasons as a result of production tolerances or of the connecting of the antenna configuration to the circuit, or for use-related reasons as a result of environmental factors or a change of carrier frequency. A difference in reactance value of this kind may be caused in the circuit too, for production-related reasons as a result of production tolerances, or for use-related reasons as a result of a change of carrier frequency.

It is an object of the invention to overcome the problems stated above in a device of the kind specified in the first paragraph, an antenna configuration of the kind specified in the second paragraph and a circuit of the kind specified in the third paragraph and to provide an improved device and an improved antenna configuration.

To achieve the object stated above, provision is made in a device of the kind specified in the first paragraph for one of the two impedances to have a resistance whose value is greater than a nominal resistance value that is adapted from the transmission of power between the antenna configuration and the circuit and smaller than a maximum resistance value that is a function of the difference in the reactance value.

To achieve the object stated above, provision is made in an antenna configuration of the kind specified in the second paragraph for the impedance of the antenna configuration to have a resistance whose value is greater than a nominal value that is adapted from the transmission of power between the antenna configuration and the circuit and smaller than a maximum value that is dependent on the difference in the reactance value.

To achieve the object stated above, provision is made in a circuit of the kind specified in the third paragraph for the impedance of the circuit to have a resistance whose value is greater than a nominal value that is adapted from the transmission of power between the antenna configuration and the circuit and smaller than a maximum value that is dependent on the difference in the reactance value.

The making of the provisions according to the invention gives the advantage that, despite the difference in the reactance value, better power transmission is obtained when transmitting power between the antenna configuration and the circuit than would be the case if the nominal value of resistance were provided, the reason being that the making of the provisions according to the invention allows a lower level of reflection of the power to be achieved. Due to the improved power transmission between the circuit and the antenna configuration, the advantage is also obtained that the distance that can be used for communication between the device containing the circuit and the antenna configuration and a communication arrangement is increased as a function of the improved transmission of power.

In the solutions according to the invention, it has also proved advantageous if the features detailed in claim 2, claim 7 and claim 11 are provided in the respective cases. This gives the advantage that it is possible for a range of resistance values in which the advantages of the invention are obtained to be defined in an analytically precise manner without the use of complicated and costly measuring systems.

In the solutions according to the invention, it has also proved advantageous if the features detailed in claim 3, claim 8 and claim 12 are provided in the respective cases. This gives the advantage that, despite the existence of what is, in the conventional sense, an obvious misadaption between the two impedances, optimized power transmission between the antenna configuration and the circuit is obtained that allows for the misadaption that exists in the given case.

In the solutions according to the invention, it has also proved advantageous if the features detailed in claim 4, claim 9 and claim 13 are provided in the respective cases. This gives the advantage that the advantages of the invention are obtained particularly in the case of an impedance that has a high quality factor.

In one solution according to the invention, it has also proved advantageous if the features detailed in claim 5 are provided. This gives the advantage that it is possible for an antenna configuration that may have a high resistance value, as is preferred by antenna manufacturers, to be produced, and yet for there to be improved power transmission, i.e. a gain in respect of the power transmission between the antenna configuration and the circuit, without there also being a difference in the resistance value from the adapted resistance value as well as the difference in the reactance value from the adapted nominal reactance value.

These and other aspects of the invention are apparent from and will be elucidated with reference to the embodiment described hereinafter, to which however the invention is not limited.

In the drawings:

FIG. 3 shows, in a similar way to FIG. 2, the curve for the range obtainable for a given difference in reactance value shown by the antenna-configuration impedance, as a function of the resistance value of a resistance of the antenna-configuration impedance.

Figure 1:
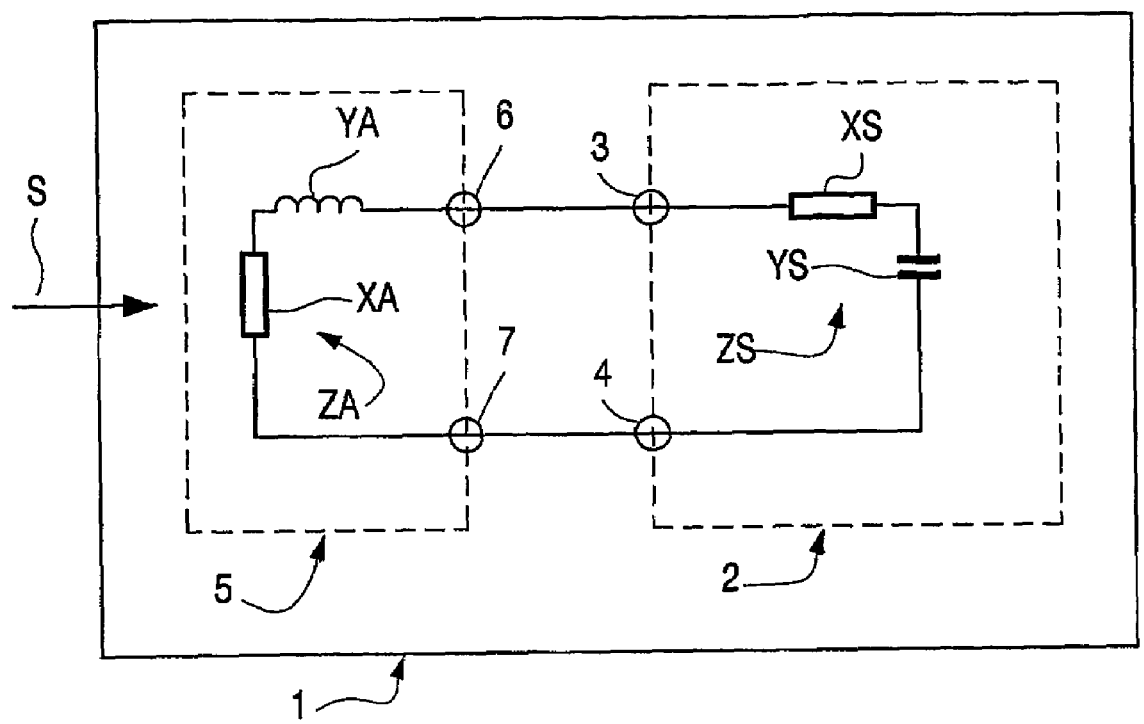
FIG. 1 is a block circuit diagram that shows, diagrammatically, a device according to the invention according to one embodiment of the invention.

Shown in FIG. 1 is a device 1 for processing a signal S, which device 1 is formed by a data carrier 1 arranged for non-contacting communication, which data carrier 1 may take the form of a transponder, or an electronic ticket, or a smart label or a chip card.

The signal S is implemented with the help of a carrier signal that is of a carrier frequency and that is intended for the communication of information between a communication arrangement (not shown in FIG. 1) and the data carrier 1, the carrier signal for communicating information being amplitude-modulated as a function of the said information in the present case. It should however be mentioned at this point that provision may be made for any other kind of modulation, such a modulation in respect of phase or frequency for example. The signal S, which can be radiated from the communication arrangement at a defined power, is also intended to supply the data carrier 1 with electrical power. Hence the distance between the data carrier and the communication arrangement that can be used for communication purposes is dependent on the power that can be made available with the help of the signal S, which decreases with increasing distance, and on the power that the data carrier is able to draw for its own operation.

The data carrier 1 has an electrical circuit 2 that is arranged for processing the signal S and that has for this purpose—as is sufficiently familiar to the person skilled in the art—at least one section for processing analog signals (not shown in FIG. 1) and at least one section for processing digital signals (not shown in FIG. 1), an a.c. equivalent circuit diagram being shown in FIG. 1 to represent the a.c. electrical properties of the at least two circuit sections. The a.c. equivalent circuit diagram has a circuit resistance XS and a circuit reactance YS, the circuit resistance XS having a resistance value of 11.5 ohm and the circuit reactance having a reactance value of −285 ohm. The circuit resistance XS and the circuit reactance YS form a circuit impedance ZS. The circuit 2 further has a first circuit terminal 3 and a second circuit terminal 4 at which the circuit 2 has the circuit impedance ZS. The circuit 2 is produced in the form of an integrated circuit in the present case, which means that, once the circuit has been manufactured, the value of its impedance ZS, which is set essentially by the particular manufacturing process and the tolerances to which the process is subject, is virtually invariable.

The data carrier 1 further has an antenna configuration 5 that is arranged to transmit the signal S arising at it and that is produced in the form of a dipole antenna in the present case. It should be mentioned at this point that some other type of antenna, such as a quadrupole or a monopole antenna for example, may also be provided. The antenna configuration 5 has a first antenna-configuration terminal 6 that is intended for connection to the first circuit terminal 3. The antenna configuration 5 also has a second antenna-configuration terminal 7 that is intended for connection to the second circuit terminal 4. What is shown for the antenna configuration 5 in FIG. 1 is an a.c. antenna equivalent circuit diagram that represents the antenna configuration 5, or rather its a.c. electrical properties, in a.c. terms. The a.c. antenna equivalent circuit diagram has an antenna resistance XA and an antenna reactance YA. The antenna resistance XA and the antenna reactance YA form an antenna impedance ZA. The antenna configuration 5 has the antenna-configuration impedance ZA at the antenna-configuration terminals 6 and 7. The values concerned are, in accordance with the invention, selectable, as will be described in detail below.

For the purpose of power transmission, and for the purpose of information transmission, between the antenna configuration 5 and the circuit 2, the first circuit terminal 3 and the first antenna-configuration terminal 6, and the second circuit terminal 4 and the second antenna-configuration terminal 7 are connected together, it being possible for the electrical power required for generating a supply voltage for the circuit 2 to be transmitted from the antenna configuration 5 to the circuit 2 by using the signal S that arises at the antenna configuration 5.

The power that can be transmitted to the circuit 2 is dependent on the power contained in the signal S that is received, i.e. mainly on the power transmitted by the communication arrangement and/or the distance that there is at the time between the communication arrangement and the data carrier 1 and/or the orientation or attitude of the data carrier 1 in space at the time. These dependences may be termed external in relation to the data carrier 1 and do not concern the invention, so nothing further will be said about them in what follows.

The power that can be transmitted to the circuit 2 is also dependent on the antenna-configuration impedance ZA or, to be more exact, on the quality of the adaption of the antenna-configuration impedance ZA to the circuit impedance ZS. In relation to the data carrier 1, this dependence is an internal dependence that does concern the invention and that will be elucidated below by reference to FIG. 2.

Figure 2:
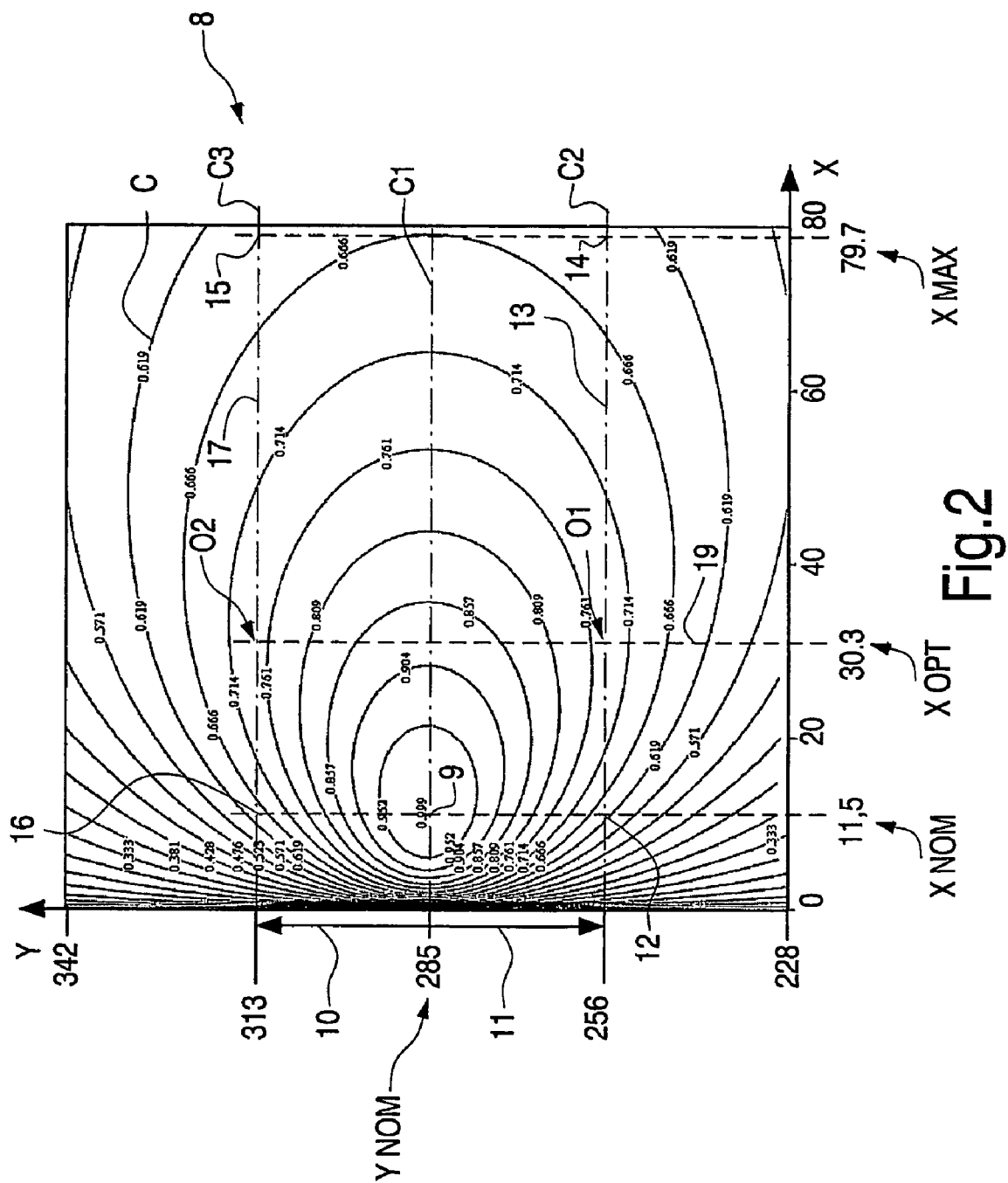
FIG. 2 is a graph that shows, diagrammatically, a family of curves for the ranges obtainable in communication between the device of FIG. 1 and a communication arrangement as a function of an antenna-configuration impedance of an antenna configuration belonging to the device.

Shown in FIG. 2 is a graph 8 in which the value X of the antenna resistance XA is shown along the X axis over a range between zero and eighty ohms and the value Y of the antenna reactance YA is shown along the Y axis over a range between two hundred and twenty-eight and three hundred and forty-two ohms. For each pair of values X and Y, the reflection coefficient $\Gamma$, which gives the proportion of reflected power that exists, as a function of the misadaption between the two impedances ZA and ZS, when power is transmitted between the antenna configuration 5 and the circuit 2, can be calculated in conventional fashion from the formula given below.

$$\Gamma = \frac{ZS - ZA^*}{ZS - ZA}$$

Here, ZA* is the conjugate complex antenna-configuration impedance for the antenna impedance ZA. For the transmission of power from the antenna configuration 5 to the circuit 2, this is dependent on the function $(1-|\Gamma|^2)$, which means that, if the value of the antenna impedance ZA is (11.5+i285) ohms, one hundred percent of the power can be transmitted from the antenna configuration 5 to the circuit 2 without any power being reflected, which in turn means that, for a given transmitted power, the maximum distance between a communication arrangement and the data carrier 1 can be used for the purpose of communication in this event. Hence, when this is the case, the antenna resistance XA has a nominal resistance value $X_{NOM}$ of 11.5 ohm and the antenna reactance YA has a nominal reactance value $Y_{NOM}$ of 285 ohm. This ideal case is identified in graph 8 by reference numeral 9.

Also shown in graph 8 are families of curves, of which one curve, standing for a plurality of curves, is identified by reference letter C. The parameter for the family of curves is the absolute value of the reflection coefficient $|\Gamma|$, with each curve representing, for a constant value of $|\Gamma|$, a constant distance between a communication arrangement and the data carrier 1 that can be used, as a maximum, for communication. Each curve is a function of the function $\sqrt{1-|\Gamma|^2}$ and is substantially in the form of an ellipse. In the case of curve C, the maximum distance that can be used, which is a function of the square root of the transmissible power, is 61.9% as a percentage of the distance that would be possible if the antenna-configuration impedance ZA were that that existed at point 9. The curves making up the family of curves therefore represent distance-specifying lines giving the maximum distances that can be used for communication.

When being manufactured, the antenna configuration 5 shown in FIG. 1 is subject to a tolerance on its antenna reactance, a mean difference in reactance $\Delta Y$ of the order of approximately ±10% from the nominal reactance value of 285 ohm that is adapted for power transmission between the antenna configuration 5 and the circuit 2 having been found in random-sampling measurements actually made on a large number of completed antenna configurations. This difference in reactance value $\Delta Y$ from the nominal reactance value $Y_{NOM}$ of 285 ohm is shown along the Y axis in graph 8 by arrows 10 and 11. Hence, at the nominal resistance value $X_{NOM}$ of 11.5 ohm, it would be possible to use only 63.5% of the distance as compared with the adapted case. This unfavorable operating point exists at a point 12 in graph 8.

To allow for the difference in reactance value $\Delta Y$, the antenna impedance ZA advantageously has an antenna resistance XA whose value is higher that the nominal resistance value $X_{NOM}$ that is adapted for the transmission of power between the antenna configuration 5 and the circuit 2 and is lower than a maximum resistance value $X_{MAX}$ that is a function of the difference in reactance value $\Delta Y$. Due to the facts that the ellipse that passes through point 12, which ellipse is not shown in FIG. 2 however, has a first axis of symmetry that extends parallel to the X axis and passes through point 9, and that this ellipse has a second axis of symmetry that extends parallel to the Y axis and is situated to the right of point 12, the maximum resistance value $W_{MAX}$ is situated to the right of the nominal resistance value $X_{NOM}$ and is approximately 79.7 ohm in the present case. The functional dependence that the maximum resistance value $X_{MAX}$ shows on the difference in reactance value $\Delta Y$ is given by the following formula:

$$X_{MAX}(\Delta Y) = \frac{\Delta Y^2}{X_{NOM}} + X_{NOM}$$

The formula or function for the maximum resistance value $X_{MAX}$ is the result of the geometrical fact that the first dotted-and-dashed line 13 that originates from point 12 and runs parallel to the X axis in graph 8 intersects the ellipse passing through point 12 at a point 14. The conditions in respect of power transmission that exist at the operating point identified by point 14 are identical to those that exist at the operating point identified by point 12. Because of the circumstances relating to symmetry affecting the ellipse that were explained above, there are two other points 15 and 16 in graph 8 to which what has just been said with regard to power transmission also applies. These two points 15 and 16 lie on a second dotted-and-dashed line 17 running parallel to the X axis. Along line 13, there are ellipses intersected between points 12 and 14 that indicate a distance that can be used for communication that is greater than is the case at points 12 and 14. The same is true of line 17.

The making of the provisions according to the invention therefore gives the advantage that, with the given difference in reactance value $\Delta Y$, if a resistance value X of between 11.5 ohm and 79.7 ohm is provided for the antenna resistance XA, the power transmission that is obtained between the antenna configuration 5 and the circuit 2 will be better than would be the case if the resistance value provided were the nominal one of 11.5 ohm. Consequently, the distance that can be used for communication purposes between the data carrier 1 and a communication station may also be a longer one than would be the case if the resistance value provided were the nominal $X_{NOM}$.

To allow this advantage to be elucidated in detail, reference will be made below to a second graph 18 that is shown in FIG. 3, in which the distance D between a communication station and the data carrier 1 is shown as a function of the value X of the antenna resistance XA. A first function F1 that is plotted in graph 18 defines the maximum available distance as a function of the antenna resistance XA, when the antenna reactance YA is of the nominal reactance value $Y_{NOM}$. The first function F1 should be seen in this case as representing a section through the graph 8 in FIG. 2 on a line C1. A second function F2 and a third function F3 that are plotted in graph 18 each define the maximum available distance as a function of the antenna resistance XA, when the antenna reactance YA is of the differing reactance value $\Delta Y$, these two functions F2 and F3 coinciding in this case. The second function F2 should be seen as representing a section through graph 8 on a line C2 and the third function as representing a section through graph 8 on a line C3. It can be seen from graph 18 that along the dotted-and-dashed lines 13 and 17 shown in graph 8 there is a gain in usable distance between points 12 and 14 and points 15 and 16 respectively as compared with the usable distance that exists at points 12, 14, 15 or 16.

The functions F2 and F3 are at a maximum of approximately 30.3 ohm at points that are identified by reference numerals 01 and 02 respectively, this maximum being defined as an optimum resistance value $X_{OPT}$. Provision is made in accordance with the invention for the antenna resistance XA of the antenna configuration 5 to be of the optimum resistance value $X_{OPT}$, in which case the optimum resistance value $X_{OPT}$ can be calculated analytically from the formula given below:

$$X_{OPT}(\Delta Y) = \sqrt{X_{NOM}^2 + \Delta Y^2}$$

The maxima of functions F2 and F3 that are identified by reference numerals 01 and 02 respectively are shown in graph 8 as, respectively, the intersection of line 13 with a line 19 that runs parallel to the Y axis and intersects the X axis at the optimum resistance value $X_{OPT}$, and the intersection of line 17 with line 19. At these intersections, lines 13 and 17 form tangents to an ellipse that represents the maximum usable distance $D(X_{OPT}, \Delta Y) = 74.2\%$ between a communication station and the data carrier 1 that exists, as a percentage of $D(X_{NOM}, Y_{NOM}) = 100\%$ in the ideally adapted case, when there is the misadaption $\Delta Y$. This should be considered in relation to the maximum usable distance of $D(X_{NOM}, \Delta Y) = 63.5\%$ or $D(X_{MAX}, \Delta Y) = 63.5\%$ that would be obtained in the case of the nominal resistance value $X_{NOM}$ or the maximum resistance value $X_{MAX}$. The loss of maximum usable distance at the operating point that is preferred in accordance with the invention is therefore merely $(100-74.2)\% = 25.8\%$ as compared with $(100-63.5)\% = 36.5\%$, which gives a gain in respect of distance of communication of $(74.2-63.5)\% = 10.7\%$.

This gives the advantage that optimum conditions with respect to the transmission of power between the antenna configuration 5 and the circuit 2 can virtually always be produced, in a repeatable and reliable manner, for virtually any desired difference in reactance value $\Delta Y$. The advantages of the invention exist in particular when the quality of the antenna impedance ZA, which is given by the formula Q=YA/XA, is greater than 2, because otherwise the shape of the ellipses is such that the effect that boosts the transmission of power comes into play to only a small extent or hardly at all.

Even though the situation relating to the two impedances ZA and ZS that was described in the case of the embodiment discussed above was such that only the antenna reactance YA had a mean difference in reactance value $\Delta Y$ and the circuit impedance ZS was of a value that was practically invariable after the circuit was manufactured, which was done to make the invention easier to describe, it should be expressly mentioned at this point that the circuit impedance ZS too may be subject to a tolerance in respect of the reactance value Y of the circuit reactance YS due to the process by which the circuit is manufactured, which means that the circuit reactance YS too may have a mean difference in reactance value $\Delta Y$ of a certain size. The differences in reactance value $\Delta Y$ of the circuit reactance YS and the antenna reactance YA may be independent of one another and may both be present simultaneously. This is the situation that exists when, for example, due to statutory stipulations or technical factors, provision has to be made from a stepped change in frequency, as a result of which there is a change in the circuit reactance YA and the antenna reactance XA due to their dependence on frequency. A difference in reactance value $\Delta Y$ of this kind may also be caused by a frequency error on the part of a transmitting means for generating the signal S. Something else that should be mentioned at this point is that a difference in reactance value $\Delta Y$ may also be caused by the process of manufacturing the device and in particular by the connection of the antenna configuration 5 to the circuit 2 or by the effect of environmental conditions on the antenna configuration 5. However, it has proved advantageous in all such cases if the steps according to the invention are taken, because this benefits the transmission of power between the antenna configuration 5 and the circuit 2 even when there is an obvious misadaption of the two reactances YS and YA to one another.

Even though what was taken as a basis in the case of the embodiment discussed above was the transmission of power for the purpose of generating a supply voltage for the circuit 2 of the data carrier 1, it should be mentioned that the making of the provisions according to the invention promotes not only an improved transmission of power but also an improved transmission of information between the antenna configuration 5 and the circuit 2 because, due to a reduction in the absolute value of the reflection coefficient $|\Gamma|$, there is also an improvement in the signal-to-noise ratio, which ratio has an essential role in the processing of the information.

It should also be mentioned that—as is the case in, for example, a device 1 that forms a radio set or a mobile telephone—the circuit 2 may also be so designed as to actively generate a signal S and this signal S may be emittable from the circuit 2 to the antenna configuration 5, from where the signal S is to be radiated at a defined transmitted power, thus enabling the advantages of the invention that are described above to come into play in the transmission of power and/or information from the circuit 2 to the antenna configuration 5.

It should also be expressly mentioned at this point that the features according to the invention relating to resistance, or rather its value, may be provided in the case of both the antenna configuration 5 and the circuit 2, regardless of whether the difference in reactance value $\Delta Y$ is present in the antenna configuration 5 or in the circuit 2.

It should further be mentioned that the antenna configuration 5 may also have more than a single antenna.

The invention claimed is:

1. A device for processing a signal, the device comprising:
an antenna configuration; and
a circuit;
wherein the antenna configuration is arranged to transmit a signal, the antenna configuration having at least one antenna-configuration terminal that is intended for connecting the antenna configuration to the circuit and the antenna configuration having an antenna-configuration impedance (ZA) at the antenna-configuration terminal;
wherein the circuit has at least one circuit terminal at which the circuit has a circuit impedance (ZS) and at which the circuit is connected to the antenna-configuration terminal for the purpose of power transmission between the antenna configuration and the circuit by using the signal,
wherein at least one of the two impedances (ZA, ZS) has, in respect of its reactance(YA, YS), a difference in reactance value (ΔY) from a nominal reactance value ($Y_{NOM}$) that is adapted for the transmission of power between the antenna configuration and the circuit, characterized in that one of the two impedances (ZA, ZS) has a resistance (XA, XS) whose value is greater than a nominal resistance value ($X_{NOM}$) that is adapted from the transmission of power between the antenna configuration and the circuit and is smaller than a maximum resistance value ($X_{MAX}$) that is a function of the difference in the reactance value (ΔY).

2. A device as claimed in claim 1, characterized in that the functional dependence that the maximum resistance value shows on the difference in reactance value is given by the formula:

$$X_{MAX}(\Delta Y)=(\Delta Y^2/X_{NOM})+X_{NOM}$$

where ΔY is the difference in reactance value and $X_{NOM}$ is the nominal resistance value.

3. A device as claimed in claim 1, characterized in that the resistance whose resistance value is greater than the nominal resistance value that is adapted for the transmission of power between the antenna configuration and the circuit and is smaller than the maximum resistance value that is a function of the difference in reactance value is an optimum resistance value given by the formula:

$$X_{OPT}(\Delta Y)\sqrt{X_{NOM}^2+\Delta Y^2}$$

where ΔY is the difference in reactance value and $X_{NOM}$ is the nominal resistance value.

4. A device as claimed in claim 1, characterized in that the quality of the two impedances has a value that is greater than two.

5. A device as claimed in claim 1, characterized in that the antenna-configuration impedance has a resistance whose value is greater than the nominal resistance value that is adapted for the transmission of power between the antenna configuration and the circuit and is smaller than the maximum resistance value that is a function of the difference in reactance value.

6. An antenna configuration for a device for processing a signal, which antenna configuration is arranged to transmit a signal, the antenna configuration comprising:
at least one antenna-congiuration terminal that is intended for connection to a circuit of the device, the circuit having at least one circuit terminal at which the circuit has a circuit impedance (ZS) and at which the circuit is connectable to the antenna-configuration terminal for the purpose of power transmission between the antenna configuration and the circuit by using the signal,
wherein the antenna configuration has an antenna-configuration impedance (ZA) at the antenna-configuration terminal, wherein at least one of the two impedances (ZA, ZS) has, in respect of its reactance (YA, YS), a difference in reactance value (ΔY) from a nominal reactance value ($Y_{NOM}$) that is adapted for the transmission of power between the antenna configuration and the circuit,
characterized in that the impedance (ZA) of the antenna configuration has a resistance (XA) whose value is greater than a nominal resistance value ($X_{NOM}$) that is adapted from the transmission of power between the antenna configuration and the circuit and is smaller than a maximum resistance value ($X_{MAX}$) that is a function of the difference in reactance values(ΔY).

7. An antenna configuration as claimed in claim 6, characterized in that the functional dependence that the maximum resistance value shows on the difference in reactance value is given by the formula:

$$X_{MAX}(\Delta Y)=(\Delta Y_2/X_{NOM})$$

where ΔY is the difference in reactance value and $X_{NOM}$ is the nominal resistance value.

8. An antenna configuration as claimed in claim 6, characterized in that the resistance whose resistance value is greater than the nominal resistance value that is adapted for the transmission of power between the antenna configuration and the circuit and is smaller than the maximum resistance value that is a function of the difference in reactance value, is an optimum resistance value given by the formula:

$$X_{OPT}(\Delta Y)\sqrt{X_{NOM}^2+\Delta Y^2}$$

where ΔY is the difference in reactance value and $X_{NOM}$ is the nominal resistance value.

9. An antenna configuration as claimed in claim 6, characterized in that the quality of the antenna-configuration impedance has a value that is greater than two.

10. A circuit for a device for processing a signal, the circuit comprising:
at least one circuit terminal at which the circuit has a circuit impedance (ZS) and at which the circuit is connectable to an antenna-configuration terminal for the purpose of power transmission between an antenna configuration and the circuit by using the signal, which antenna configuration is arranged for the transmission of the signal which antenna configuration has at least one antenna-configuration terminal that is intended for connecting the antenna configuration to the circuit, and which antenna configuration has an antenna-configuration impedance (ZA) at the antenna-configuration terminal, wherein at least one of the two impedances (ZA, ZS) has, in respect of its reactance (YA, YZ), a difference in reactance value (ΔY) from a nominal reactance value ($Y_{NOM}$) that is adapted for the transmission of power between the antenna configurations and the circuit,
characterized in that the impedance of the circuit (ZS) has a resistance (XS) whose value is greater than a nominal resistance value ($X_{NOM}$) that is adapted from the transmission of power between the antenna configuration and the circuit and is smaller than a maximum resistance value ($X_{MAX}$) that is a function of the difference in the reactance value (ΔY).

11. A circuit as claimed in claim 10, characterized in that the functional dependence that the maximum resistance value shows on the difference in reactance value is given by the formula:

$$X_{MAX}(\Delta Y)=(\Delta Y^2/X_{NOM})+X_{NOM}$$

where ΔY is the difference in reactance value and $X_{NOM}$ is the nominal resistance value.

12. A circuit as claimed in claim 10, characterized in that the resistance whose resistance value is greater than the nominal resistance value that is adapted for the transmission of power between the antenna configuration and the circuit and is smaller than the maximum resistance value that is a function of the difference in reactance value, is an optimum resistance value given by the formula:

$$X_{OPT}(\Delta Y)\sqrt{X_{NOM}^2+\Delta Y^2}$$

where ΔY is the difference in reactance value and $X_{NOM}$ is the nominal resistance value.

13. A circuit as claimed in claim 10, characterized in that the quality of the circuit impedance has a value that is greater than two.

* * * * *